(12) United States Patent
Delperier et al.

(10) Patent No.: US 7,241,470 B2
(45) Date of Patent: Jul. 10, 2007

(54) METHOD FOR MONITORING THE COURSE OF A PROCESS USING A REACTIVE GAS CONTAINING ONE OR SEVERAL HYDROCARBONS

(75) Inventors: Bernard Delperier, Martignas sur Jalles (FR); Eric Thibaudeau, Bruges (FR)

(73) Assignee: Snecma Propulsion Solide, Le Haillan (FR)

( * ) Notice: Subject to any disclaimer, the term of this patent is extended or adjusted under 35 U.S.C. 154(b) by 0 days.

(21) Appl. No.: 10/499,415

(22) PCT Filed: Dec. 20, 2002

(86) PCT No.: PCT/FR02/04492

§ 371 (c)(1),
(2), (4) Date: Jan. 21, 2005

(87) PCT Pub. No.: WO03/054246

PCT Pub. Date: Jul. 3, 2003

(65) Prior Publication Data

US 2005/0163929 A1    Jul. 28, 2005

(30) Foreign Application Priority Data

Dec. 20, 2001    (FR) .................... 01 16518

(51) Int. Cl.
*C23C 16/00* (2006.01)
*B01D 53/14* (2006.01)
*C07C 7/00* (2006.01)
*C07C 7/10* (2006.01)

(52) U.S. Cl. ............... 427/8; 427/249.2; 585/800; 585/833; 95/187; 96/322

(58) Field of Classification Search .............. 427/8, 427/249.2; 585/648, 800, 833; 95/202, 95/187; 96/322
See application file for complete search history.

(56) References Cited

U.S. PATENT DOCUMENTS

| | | | | |
|---|---|---|---|---|
| 2,721,888 A * | 10/1955 | Harris | .................. | 585/634 |
| 5,348,774 A * | 9/1994 | Golecki et al. | ............. | 427/543 |
| 5,747,096 A | 5/1998 | Golecki et al. | | |
| 5,824,136 A * | 10/1998 | Meline | ................... | 95/29 |
| 5,916,365 A * | 6/1999 | Sherman | .................. | 117/92 |
| 6,001,419 A | 12/1999 | Leluan et al. | | |
| 6,210,745 B1 * | 4/2001 | Gaughan et al. | .............. | 427/8 |
| 2003/0101869 A1 * | 6/2003 | Baudry et al. | ................ | 95/237 |

FOREIGN PATENT DOCUMENTS

WO    WO 96/31447    10/1996

* cited by examiner

*Primary Examiner*—Timothy Meeks
*Assistant Examiner*—David Turocy
(74) *Attorney, Agent, or Firm*—Weingarten, Schurgin, Gagnebin & Lebovici LLP

(57) ABSTRACT

The method applies to a process such as cementation or chemical vapor infiltration or deposition, the process being carried out in an oven and the method comprising setting operating parameters of the oven, introducing a reagent gas into the oven, the reagent gas containing at least one gaseous hydrocarbon, and extracting from the oven an effluent gas containing reaction by-products of the reagent gas. The effluent gas is subjected to washing in oil that absorbs tars contained in the effluent gas, and information about the progress of the process is obtained by measuring the quantity of tar absorbed by the oil.

9 Claims, 1 Drawing Sheet

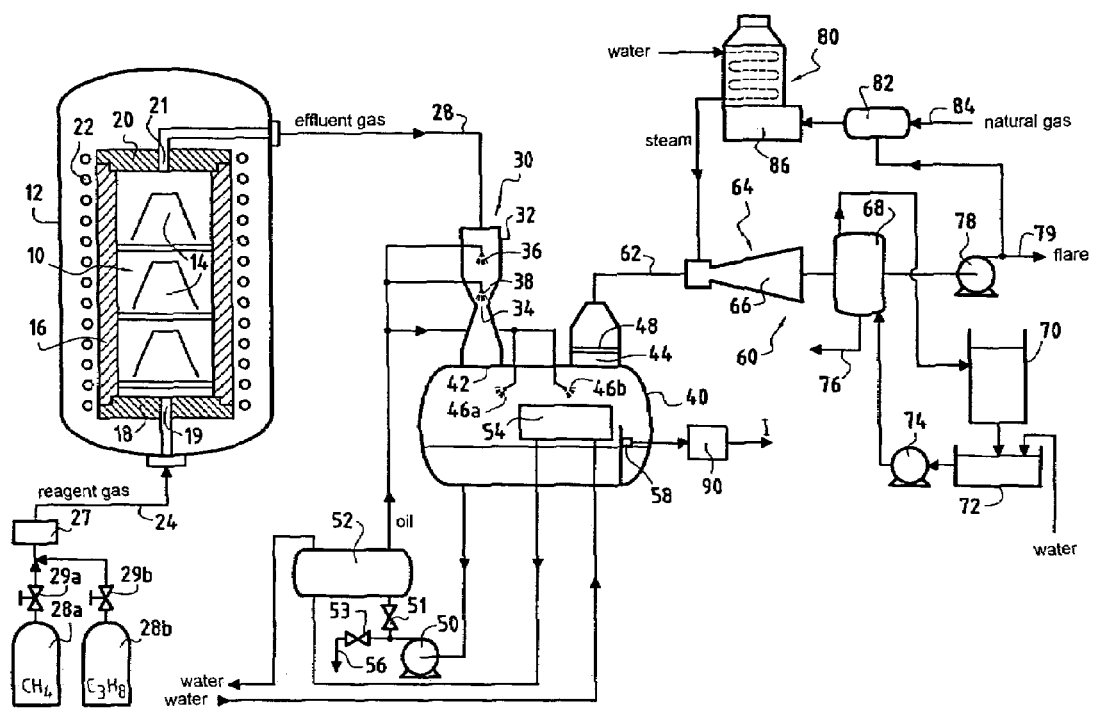

METHOD FOR MONITORING THE COURSE OF A PROCESS USING A REACTIVE GAS CONTAINING ONE OR SEVERAL HYDROCARBONS

This application is a 371 national phase filing of PCT/FR02/04492 filed Dec. 20, 2002, and claims priority to a French application No. 01/16518 filed Dec. 20, 2001.

BACKGROUND OF THE INVENTION

The invention relates to processes making use of a reagent gas containing one or more gaseous hydrocarbons, in particular processes for cementation of parts, for forming coatings of pyrolytic carbon on substrates by chemical vapor deposition (CVD), or for densifying porous substrates with a pyrolytic carbon matrix formed by chemical vapor infiltration (CVI).

One particular, but non-exclusive, field of application of the invention lies in making composite material parts comprising a fiber reinforcing substrate or "preform" densified by a matrix of pyrolytic carbon, and in particular carbon/carbon (C/C) composite material parts.

Substrates for densification are placed in an oven into which a reagent gas containing one or more precursors is introduced at low pressure. The precursor is constituted by one or more gaseous hydrocarbons, typically methane, propane, or a mixture thereof. The operating parameters of the oven are adjusted so as to produce the pyrolytic carbon matrix by decomposing (cracking) the precursor gas in contact with the substrate. An effluent gas containing reaction by-products is extracted from the oven by pumping.

Usually, the operating parameters of the oven, in particular the temperature of the oven, the pressure inside the oven, the flow rate of reagent gas through the oven, and the composition of the reagent gas, are constant throughout the densification process. Unfortunately, infiltration conditions change as the process advances because the initial pores within the substrate become progressively filled in. The selected parameters thus result from seeking the best compromise between the optimum that is suitable for the beginning of densification and the optimum that is suitable at the end of densification, but with a risk of a modification to the microstructure of the deposited matrix material because of the changing pore size of the substrates, i.e. the changing geometrical characteristics of the pores. Adapting the operating parameters of the oven to progress in the densification process could enable the process to be optimized overall, thereby reducing the time needed to obtain a desired level of densification and ensuring that the matrix material is formed with the desired microstructure.

Thus, in document WO 96/31447, the Applicant has proposed varying the operating parameters of the oven so as to optimize the densification process while controlling the microstructure of the matrix material. Nevertheless, that variation is undertaken in application of a pre-established model, and does not take account of the real progress of the process.

Proposals are also made in document U.S. Pat. No. 5,348,774 to measure variation in substrate weight on a continuous basis so as to monitor progress in the densification process. As a function of the measured variation, it is possible to act on various parameters, in particular the power supplied to an induction coil which serves to heat the oven, by coupling with a susceptor defining the side wall of the oven. Monitoring variation in the weight of the substrates also makes it possible to detect when the densification process has come to an end. However, this requires the oven to be specially arranged to make it possible to measure substrate weight on a continuous basis, even at the high temperatures that exist in the oven. Such arrangements can also be penalizing on the substrate-loading capacity in the inside working volume of the oven.

OBJECT AND SUMMARY OF THE INVENTION

An object of the invention is to provide a method enabling a process of densifying substrates with a pyrolytic carbon matrix to be monitored continuously, without requiring any special arrangement inside the infiltration oven.

More generally, an object of the invention is to propose a method of continuously monitoring a process implemented in an oven using a reagent gas containing gaseous hydrocarbons at relatively high temperature and leading to the presence of tars in an effluent gas extracted from the oven.

This object is achieved by a method in which, in accordance with the invention, the effluent gas extracted from the oven is subjected to washing with an oil that absorbs tars contained in the effluent gas, with information about the progress of the process being obtained by measuring the quantity of tar absorbed by the oil, advantageously using a magnitude representative of the variation over time in the quantity of tar absorbed by the oil.

To this end, the oil can be caused to circulate around a closed circuit and the increase in the volume or the weight of the oil is measured. Thus, in an implementation of the method, the oil is taken continuously from a tank in order to be injected into a stream of effluent gas, with the tar-filled oil being returned to the tank, and with the information concerning the progress of the process being obtained by measuring variation in the level of the oil in the tank. The oil may be injected into a stream of effluent gas flowing in a spray column, e.g. a Venturi column.

The oil is preferably an aromatic oil capable of absorbing polycyclic aromatic hydrocarbons contained in the effluent gas. The oil may be selected in particular from aromatic mineral oils such as, for example, oils based on xylenes.

The information obtained about the progress of the process can be used to determine when the process ends.

It is also possible to control the process by responding to the information obtained concerning the progress of the process to modify, where appropriate, at least one of the following operating parameters of the oven: oven temperature; pressure inside the oven; flow rate of reagent gas through the oven; and composition of the reagent gas.

The method of the invention can be used in particular for monitoring processes of cementation, chemical vapor deposition, or densification by chemical vapor infiltration.

Monitoring a chemical or physico-chemical process by analyzing reaction by-products in an effluent from an oven or a reactor is a well-known technique. In the particular case of chemical vapor infiltration using a reagent gas containing gaseous hydrocarbons such as methane and/or propane, it might be envisaged that the effluent gas extracted from the oven could be analyzed in order to measure the quantity of some particular reaction by-product that is produced, for example benzene which is a good indicator of how the process is progressing. Nevertheless, such measurement is made difficult to perform because the effluent gas contains very many light and heavy hydrocarbons including a relatively large quantity of tars that are liable to clog up measurement pipework and equipment quickly.

The Applicant has found that merely monitoring the quantity of tar absorbed by an oil used for washing the effluent gas provides a reliable indication concerning the progress of the process, without requiring recourse to complex apparatus and while being entirely suitable for integration in an installation for processing effluent gas. In order to avoid clogging up pipework and in order to satisfy environmental requirements, it is highly desirable to treat the effluent gas so as to eliminate the tars. Eliminating tars by washing in oil is a treatment method that is effective. The present invention can take advantage of the use of such a treatment method for the purpose of continuously monitoring the process in a manner that is simple and inexpensive.

BRIEF DESCRIPTION OF THE DRAWING

The invention will be better understood on reading the following indicative but non-limiting description made with reference to the sole FIGURE of the accompanying drawing which shows an industrial installation for chemical vapor infiltration enabling a method of the invention to be implemented.

DETAILED DESCRIPTION OF AN IMPLEMENTATION OF THE INVENTION

FIG. 1 shows in highly diagrammatic manner a chemical vapor infiltration installation for densifying porous substrates with a pyrolytic carbon matrix. The chemical vapor infiltration process may be of the isothermal-isobaric type, i.e. without using a temperature gradient or a pressure gradient across the substrate, or it may be of the temperature gradient type, i.e. with the substrate being heated non-uniformly, or it may be of the pressure gradient type, i.e. having different pressures on opposite faces of the substrates.

An oven 10 housed in a casing 12 receives porous substrates 14 for densification, for example fiber preforms for parts that are to be made out of carbon-matrix composite material. Examples of fiber preforms are preforms for divergent portions or divergent portion elements of rocket engine nozzles, or preforms for C/C composite brake disks. The oven 10 is defined by a susceptor-forming side wall 16, e.g. made of graphite, together with a bottom 18 and a cover 20, likewise made of graphite. The susceptor is coupled with an induction coil 22 that surrounds it. The oven is heated essentially by radiation from the susceptor which is heated by being inductively coupled with the induction coil.

A reagent gas is introduced via a pipe 24 passing through an inlet 19 formed in the bottom 18 of the oven. The reagent gas comprises one or more carbon-precursor components, possibly together with a dopant. In the example shown, the reagent gas is made up of two components coming from sources 25a and 25b connected to the pipe 24 via valves 26a and 26b, and via a device 27 for measuring flow rate. An effluent gas is extracted from the oven via an outlet 21 formed in the cover 20 and a pipe 28 connected to a pump device 60 which causes reagent gas to flow through the oven and which maintains the desired low pressure inside the oven.

The gaseous precursors of pyrolytic carbon are constituted in particular by alkanes, alkyls, and alkenes, typically methane, propane, or a mixture thereof, producing carbon by decomposition (cracking) in contact with the substrates to be densified. The term "dopant" is used herein to mean an optional component of the reagent gas that performs a function of activating the deposition of pyrolytic carbon from the precursor(s) under selected operating conditions. A dopant may also constitute a precursor. Thus, in a reagent gas comprising a mixture of methane and propane (both precursors) coming from sources 28a and 28b, the propane may also act as a dopant under certain conditions of temperature and pressure.

The degree of final densification of the substrates and the microstructure of the pyrolytic carbon are determined in particular by the operating parameters of the oven, which are as follows:
  oven temperature;
  pressure inside the oven;
  flow rate of reagent gas through the oven; and
  composition of the reagent gas, namely, in particular, the precursor content in the reagent gas and the dopant content, if any.

The effluent gas contains by-products of the (cracking) reaction of the pyrolytic carbon precursor(s), together with those precursor(s) that have not reacted, and hydrogen gas ($H_2$) coming from the cracking of the precursor(s). The reaction by-products include unsaturated hydrocarbons, light aromatic hydrocarbons (benzene, monocyclic hydrocarbons), and polycyclic aromatic hydrocarbons (PAHs) such as, in particular: naphthalene, pyrene, anthracene, and acenaphthylene which condense in the form of tars.

In accordance with the invention, the progress of the substrate densification process is monitored by subjecting the effluent gas to washing in an oil that absorbs these tars, and by deriving a magnitude representative of the quantity of tar that has been absorbed by the oil.

This washing in oil also makes it possible to eliminate the tars which would otherwise clog up the outlet pipework from the oven and which could end up in the pumping device used, e.g. in the oil of the vacuum pump or in a condensate from a steam ejector.

An embodiment of an oil washing device 30 interposed between the outlet for effluent gas from the oven 10 and the pumping device 60 is shown in the accompanying figure. Such a device is also described in co-pending U.S. patent application Ser. No. 10/265,204 filed on Oct. 4, 2002, the content of which is hereby incorporated by reference.

The oil washing device is preferably placed close to the outlet from the oven 10 so as to avoid tar deposits forming in the pipe connecting the oven outlet to the washing device, where such deposits are encouraged by the effluent gas cooling down.

The oil washing device 30 comprises a spray column 32 which is connected to the pipe 26 at its top end. By way of example, the column 32 is a Venturi column 34 formed by a constriction in the flow section for the gas. At its bottom end, the column 32 communicates with a gas inlet 42 formed through the top wall of an oil recirculation tank 40, in the vicinity of one end thereof. A gas outlet 44 also passes through the top wall of the tank 40 and communicates via a pipe 42 with the pumping device 60.

An oil outlet is formed through the bottom portion of the tank 40 and is connected to a pump 50 which extracts oil from the tank 40 in order to feed nozzles 36, 38 disposed substantially axially in the column 32, and passing via a heat exchanger 52. Additional nozzles 46a and 46b may be placed in the tank 40, the nozzles 46a and 46b being fed with oil downstream from the heat exchanger 52, in parallel with the nozzles 36, 38. The heat exchanger 52 has a cooling fluid, e.g. cold water, passing therethrough for the purpose of cooling the oil coming from the tank 40. The cooling water also passes through a heat exchanger 54, e.g. in the form of plates, connected in series with the heat exchanger 52 and placed inside the tank 40.

The heat exchanger 54 and also the nozzles 46a and 46b are housed inside the tank between the gas inlet 42 and the gas outlet 44, above the level of the oil. A droplet remover 48 may be installed at the gas outlet 44 from the tank 40.

The oil washing device 30 operates as follows. The oil fed to the nozzles 36 and 38 is sprayed into the flow of effluent gas traveling along the column 32, with such spraying being encouraged by the increase in the speed of the gas due to the presence of the Venturi. One of the nozzles 36 may be provided at the top end of the column 32, upstream from the Venturi 34, while the other nozzle 38 is provided at the throat of the Venturi. It is also possible to use only one nozzle 36 or 38.

The sprayed oil absorbs a large fraction of the tars conveyed by the effluent gas, in particular polycyclic aromatic hydrocarbons (PAHs) and they are entrained into the bath of oil contained in the tank 40.

The oil used must present vapor pressure that is low enough to avoid vaporizing at the pressure that exists at the outlet from the oven 10 so as to avoid loading the effluent gas with oil vapor. As an indication, the pressure inside the oven 10 during a conventional process of densifying porous substrates with a pyrolytic carbon matrix is generally less than 10.1 kilopascals (kPa). The oil must also present viscosity that is low enough to enable it to be circulated and form a mist at the outlet from the nozzles.

That is why it is preferable to use an aromatic mineral oil with vapor pressure of less than 100 Pascals (Pa) at 0° C.

Advantageously, a xylene-based oil is used such as the synthetic oil sold under the name "Jarithem AX 320" by the French supplier Elf Atochem, which is constituted by 85% by weight mono-xylylxylene and 15% by weight di-xylylxylene. This oil has viscosity of 60 centipoises at 0° C. and a vapor pressure of less than 100 Pa at 0° C.

The heat exchangers 52 and 58 are fed with cold water at a temperature close to 0° C. in order to cool as much as possible the oil injected by the nozzles 36 and 38, and also the oil that is injected via the nozzles 46a and 46b onto the path between the gas inlet and the outlet of the tank 40.

The heat exchanger 54 contributes to encouraging tars that still exist in the effluent gas to condense at the outlet from the column 32.

The droplet remover 48, e.g. of the baffle type contributes to "breaking up" a mist that is present at the outlet from the tank 40 so as to separate out the droplets and cause them to coalesce so that they can be collected in the bath of oil.

The trapping performed by the oil washing device 30 enables a maximum amount of tars such as PAHs to be eliminated. Only the lightest aromatic hydrocarbons (benzenes, monocyclic hydrocarbons) can remain in the washed effluent gas, however they do not present any risk of clogging the pipes because of their higher vapor pressure.

By way of example, the pumping device 60 comprises an ejector-condenser 64, or a plurality of similar ejector-condensers connected in series (only one being shown in the figure), it being understood that other pumping devices could also be used, for example rotary pumps.

The ejector-condenser 64 comprises an ejector portion 66 fed with steam by a boiler 80, and a condenser portion 68 situated downstream from the ejector. The condenser 68 is an indirect condenser, the gas coming from the ejector being brought into contact with pipes conveying a cooling fluid, e.g. cold water.

After passing through the condenser 68, the water is taken to a cooling tower 70 where it can be collected in a tank 72 from which it is returned to the condenser 68 by a pump 74.

The condensate picked up in an outlet pipe 76 from the condenser contains hydrocarbons such as benzene, toluene, xylene, and also any residue of PAHs dissolved in the water coming from condensation of steam from the ejector 66. The condensate may be treated by adsorption on activated carbon.

At the outlet from the condenser, the effluent gas passes through a pump 78. It is possible to use a water level pump cooled by a heat exchanger so that the gas extracted from the treatment installation is practically at ambient temperature.

The extracted gas contains essentially unsaturated hydrocarbons, plus a residue of reagent gas and of hydrogen gas $H_2$ coming from the oven 10. It can be taken to a torch via a pipe 79 and it can be used at least in part as fuel gas for the boiler 80. Under such circumstances, it is mixed in a buffer balloon 82 with gaseous fuel, e.g. natural gas, for the purpose of feeding the burners 86 in the boiler 80.

In the example shown, the quantity of tar absorbed by the washing oil is evaluated by measuring the level of the oil in the tank 40. A sensor 58 provides a processor circuit 90 with a signal representative of oil level for the purpose of generating information I that is usable for monitoring the densification process. The sensor 58 may be of any known type, for example of the vibrating blade type or of the radar type, in which case it measures the distance between the top wall of the tank in which the detector is housed, and the surface of the oil.

The information I is, for example, representative of the derivative with respect to time of the signal representing oil level, so as to represent the way in which the quantity of tars present in the effluent gas varies over time.

A first possibility consists in monitoring the information I so as to detect the end of the densification process. It can be assumed that the densification process has been completed once the variation in oil level, i.e. the variation in the quantity of tars present in the effluent gas, increases above a given threshold, for example increases by more than 2% over a given observation period. This may be one to several hours, since the duration of densification cycles is usually very long.

Another possibility, which can be used in addition to the first possibility, consists in controlling the operating properties of the oven as a function of the value of the information I. Thus:

when the rate of variation in oil level as measured over a given observation period drops below a threshold $S_1$, e.g. about 0.1%, it is possible to act on the densification parameters (e.g. temperature, reagent gas composition) so as to amplify densification; and when the variation in oil level increases to above a threshold $S_2$, e.g. about 1%, it is possible to act on the densification parameters so as to slow densification down.

As an indication, for a nominal flow rate of 500 liters per minute (L/min) of reagent gas admitted to the oven (mixture of methane and propane), the threshold $S_1$ may correspond to a decrease in tar weight variation by an amount lying in the range 0.5 grams per hour (g/h) to 2 g/h, and the threshold $S_2$ may correspond to an increase in the variation of tar weight lying in the range 5 g/h to 8 g/h.

At the end of the process, the tank 40 can be emptied at least in part from the outlet of the pump 50 by closing the valve 51 installed in the pipe connecting the pump 50 to the heat exchanger 52, and by opening a valve 53 mounted in a pipe connecting the outlet of the pump 50 to a waste oil outlet 56. The waste oil that is recovered can be destroyed by being incinerated, and clean oil is added to the tank 40.

Naturally, means other than measuring the increase in the level or volume in a recirculation tank could be used for monitoring the quantity of tars absorbed by the washing oil, for example means for measuring the increase in the weight of the oil.

It should also be observed that variation in the level or the weight of the oil in the tank 40 can be converted into a magnitude that is representative of progress in the densification process, for example into an equivalent quantity of benzene contained in the effluent gas.

As already mentioned, the method in accordance with the invention can be implemented to monitor the progress of processes other than densification by chemical vapor infiltration, providing the processes are performed in an oven that makes use of a reagent gas containing gaseous hydrocarbons, in particular methane and/or propane, at a temperature that is relatively high, and with tars being produced in an effluent gas. These other processes include in particular chemical vapor deposition to form coatings of pyrolytic carbon on substrates, which processes are usually performed at a temperature of about 1000° C. or higher, and cementation of parts in an oven which can make use of a mixture of methane and propane at a temperature of about 900° C.

What is claimed is:

1. A method of controlling a CVI process running in an oven and using a reagent gas containing at least one gaseous hydrocarbon, said process comprising the steps of:
    setting the operating parameters of the oven,
    introducing the reagent gas containing at least one gaseous hydrocarbon in the oven,
    extracting from the oven an effluent gas containing reaction by-products of the reagent gas, including tars,
    washing the effluent gas with an oil that absorbs tars contained in the effluent gas, the oil being caused to circulate around a closed circuit by taking continuously the oil from a tank so as to be injected into a stream of effluent gas and returning the oil loaded with tars to the tank,
    providing an information representative of the magnitude of variation over time in the level of oil in the tank, said information being representative of the variation over time in the quantity of tars absorbed by the oil, and
    controlling the process by modifying at least one of the oven temperature, pressure inside the oven, flow rate of the reagent gas through the oven and composition of the reagent gas when said magnitude drops below a first threshold value or increases to above a second threshold value.

2. A method according to claim 1, wherein the oil is injected into a stream of effluent gas flowing in a spray column.

3. A method according to claim 2, wherein the effluent gas flows through a Venturi column.

4. A method according to claim 1, wherein the oil is an oil capable of absorbing polycyclic aromatic hydrocarbons contained in the effluent gas.

5. A method according to claim 4, wherein the oil is selected from aromatic mineral oils.

6. A method of determining the end of a CVI process implemented in an oven and using a reagent gas containing at least one gaseous hydrocarbon, said process comprising the steps of:
    setting the operating parameters of the oven,
    introducing the reagent gas containing at least one gaseous hydrocarbon in the oven,
    extracting from the oven an effluent gas containing reaction by-products of the reagent gas, including tars,
    washing the effluent gas with an oil that absorbs tars contained in the effluent gas,
    measuring the quantity of tars absorbed by the oil,
    deriving from the measured quantity of tars a magnitude representative of the variation over time in the quantity of tars absorbed by the oil, and
    determining the end of the process as a result of said magnitude exceeding a given threshold over a given observation period.

7. A method according to claim 6, wherein the oil is caused to circulate around a closed circuit and the increase in oil volume is measured.

8. A method according to claim 7, wherein the oil is taken continuously from a tank so as to be injected into a stream of effluent gas, the oil loaded with tars is returned to the tank, and the information about the progress of the process is obtained by measuring variation in the level of oil in the tank.

9. A method according to claim 6, wherein the oil is caused to circulate around a closed circuit and the increase in oil weight is measured.

* * * * *